(12) United States Patent
Verghese et al.

(10) Patent No.: US 10,468,291 B2
(45) Date of Patent: Nov. 5, 2019

(54) REACTION SYSTEM FOR GROWING A THIN FILM

(71) Applicant: ASM America, Inc., Phoenix, AZ (US)

(72) Inventors: Mohith Verghese, Phoenix, AZ (US); Kyle Fondurulia, Phoenix, AZ (US); Carl White, Gilbert, AZ (US); Eric Shero, Phoenix, AZ (US); Darko Babic, Chandler, AZ (US); Herbert Terhorst, Amersfoort (NL); Marko Peussa, Espoo (FI); Min Yan, Nieuwegein (NL)

(73) Assignee: ASM America, Inc., Phoenix, AZ (US)

( * ) Notice: Subject to any disclaimer, the term of this patent is extended or adjusted under 35 U.S.C. 154(b) by 331 days.

(21) Appl. No.: 15/092,414

(22) Filed: Apr. 6, 2016

(65) Prior Publication Data
US 2016/0233124 A1    Aug. 11, 2016

Related U.S. Application Data

(62) Division of application No. 13/529,223, filed on Jun. 21, 2012, now Pat. No. 9,359,672, which is a division
(Continued)

(51) Int. Cl.
*C23C 16/40* (2006.01)
*H01L 21/687* (2006.01)
(Continued)

(52) U.S. Cl.
CPC .... *H01L 21/68785* (2013.01); *C23C 16/4408* (2013.01); *C23C 16/455* (2013.01);
(Continued)

(58) Field of Classification Search
CPC ............ C23C 16/455; C23C 16/45517; C23C 16/45525; C23C 16/45561;
(Continued)

(56) References Cited

U.S. PATENT DOCUMENTS

| 4,270,999 A | 6/1981 | Hassan et al. |
| 4,533,410 A | 8/1985 | Ogura et al. |
| (Continued) | | |

FOREIGN PATENT DOCUMENTS

| JP | 07018438 A2 | 1/1995 |
| JP | 08148541 A2 | 6/1996 |
| (Continued) | | |

OTHER PUBLICATIONS

Mason et al., "Influence of gas mixing and expansion in horizontal MOVPE reactors". Journal of Crystal Growth. vol. 107, No. 1 / 4, Jan. 1991, pp. 181-187.
(Continued)

*Primary Examiner* — Rudy Zervigon
(74) *Attorney, Agent, or Firm* — Knobbe Martens Olson & Bear LLP

(57) ABSTRACT

An atomic deposition (ALD) thin film deposition apparatus includes a deposition chamber configured to deposit a thin film on a wafer mounted within a space defined therein. The deposition chamber comprises a gas inlet that is in communication with the space. A gas system is configured to deliver gas to the gas inlet of the deposition chamber. At least a portion of the gas system is positioned above the deposition chamber. The gas system includes a mixer configured to mix a plurality of gas streams. A transfer member is in fluid communication with the mixer and the gas inlet. The transfer member comprising a pair of horizontally divergent walls configured to spread the gas in a horizontal direction before entering the gas inlet.

8 Claims, 16 Drawing Sheets

Related U.S. Application Data of application No. 11/333,127, filed on Jan. 17, 2006, now Pat. No. 8,211,230.

(60) Provisional application No. 60/656,832, filed on Feb. 24, 2005, provisional application No. 60/645,581, filed on Jan. 18, 2005.

(51) Int. Cl.
| | | |
|---|---|---|
| *C23C 16/455* | (2006.01) | |
| *C23C 16/458* | (2006.01) | |
| *C23C 16/44* | (2006.01) | |
| *C30B 35/00* | (2006.01) | |
| *H01L 21/67* | (2006.01) | |

(52) U.S. Cl.
CPC ........ *C23C 16/458* (2013.01); *C23C 16/4582* (2013.01); *C23C 16/4583* (2013.01); *C23C 16/4586* (2013.01); *C23C 16/45517* (2013.01); *C23C 16/45525* (2013.01); *C23C 16/45544* (2013.01); *C23C 16/45561* (2013.01); *C23C 16/45563* (2013.01); *C23C 16/45582* (2013.01); *C23C 16/45587* (2013.01); *C23C 16/45591* (2013.01); *C30B 35/00* (2013.01); *H01L 21/67236* (2013.01); *H01L 21/68714* (2013.01); *H01L 21/68742* (2013.01)

(58) Field of Classification Search
CPC ........ C23C 16/45591; C23C 16/45587; C23C 16/4582; C23C 16/4583
USPC ...................................... 118/715; 156/345.33
See application file for complete search history.

(56) References Cited

U.S. PATENT DOCUMENTS

| | | | |
|---|---|---|---|
| 4,560,420 A | 12/1985 | Lord | |
| 4,589,369 A | 5/1986 | Mahler | |
| 4,761,269 A | 8/1988 | Conger et al. | |
| 4,978,567 A | 12/1990 | Miller | |
| 4,986,215 A | 1/1991 | Yamada et al. | |
| 5,024,748 A | 6/1991 | Fujimura | |
| 5,077,875 A | 1/1992 | Hoke et al. | |
| 5,188,501 A | 2/1993 | Tomita et al. | |
| 5,198,034 A | 3/1993 | DeBoer et al. | |
| 5,242,501 A | 9/1993 | McDiarmid | |
| 5,322,079 A | 6/1994 | Fukutomi et al. | |
| 5,370,738 A | 12/1994 | Watanabe et al. | |
| 5,403,401 A | 4/1995 | Haafkens et al. | |
| 5,427,620 A | 6/1995 | DeBoer et al. | |
| 5,444,217 A * | 8/1995 | Moore ................ | C23C 16/4404 219/405 |
| 5,514,439 A | 5/1996 | Sibley | |
| 5,527,393 A * | 6/1996 | Sato ................... | C23C 16/45521 118/500 |
| 5,532,190 A | 7/1996 | Goodyear et al. | |
| 5,588,827 A | 12/1996 | Muka | |
| 5,651,670 A | 7/1997 | Okase et al. | |
| 5,683,518 A | 11/1997 | Moore et al. | |
| 5,690,742 A | 11/1997 | Ogata et al. | |
| 5,730,801 A | 3/1998 | Tepman et al. | |
| 5,746,875 A | 5/1998 | Maydan et al. | |
| 5,761,023 A | 6/1998 | Lue et al. | |
| 5,800,622 A | 9/1998 | Takemi et al. | |
| 5,803,977 A | 9/1998 | Tepman et al. | |
| 5,853,214 A | 12/1998 | Babbs et al. | |
| 5,887,117 A | 3/1999 | Desu et al. | |
| 5,935,490 A | 8/1999 | Archbold et al. | |
| 6,001,183 A | 12/1999 | Guray et al. | |
| 6,001,267 A | 12/1999 | Os et al. | |
| 6,002,108 A | 12/1999 | Yoshioka | |
| 6,093,252 A | 7/2000 | Wengert et al. | |
| 6,113,702 A | 9/2000 | Halpin et al. | |
| 6,113,984 A | 9/2000 | MacLeish et al. | |
| 6,156,151 A | 12/2000 | Komino et al. | |
| 6,163,015 A * | 12/2000 | Moore .................... | H01L 21/68 118/729 |
| 6,203,622 B1 | 3/2001 | Halpin et al. | |
| 6,214,116 B1 | 4/2001 | Shin | |
| 6,245,152 B1 | 6/2001 | Imai et al. | |
| 6,264,467 B1 | 7/2001 | Lue et al. | |
| 6,302,965 B1 | 10/2001 | Umotoy et al. | |
| 6,306,216 B1 | 10/2001 | Kim, II et al. | |
| 6,394,797 B1 | 5/2002 | Sugaya et al. | |
| 6,415,736 B1 | 7/2002 | Hao et al. | |
| 6,539,891 B1 | 4/2003 | Lee et al. | |
| 6,630,201 B2 | 10/2003 | Chiang et al. | |
| 6,634,882 B2 | 10/2003 | Goodman | |
| 6,666,921 B2 | 12/2003 | Sakai et al. | |
| 6,729,875 B2 | 5/2004 | Goodman | |
| 6,820,570 B2 | 11/2004 | Kilpela et al. | |
| 6,840,767 B2 | 1/2005 | Goodman | |
| 6,916,398 B2 | 7/2005 | Chen et al. | |
| 7,017,514 B1 | 3/2006 | Shepherd, Jr. et al. | |
| 7,138,336 B2 | 11/2006 | Lee et al. | |
| 7,163,587 B2 | 1/2007 | Kinnard et al. | |
| 7,175,713 B2 | 2/2007 | Thakur et al. | |
| 7,228,873 B2 | 6/2007 | Ku et al. | |
| 7,252,716 B2 | 8/2007 | Kim et al. | |
| 7,264,846 B2 | 9/2007 | Chang et al. | |
| 7,387,686 B2 | 6/2008 | Iwamoto et al. | |
| 7,422,636 B2 | 9/2008 | Ishizaka | |
| 7,582,181 B2 | 9/2009 | Babic | |
| 7,608,549 B2 | 10/2009 | Van Nooten et al. | |
| 7,648,578 B1 | 1/2010 | Itatani et al. | |
| 7,669,932 B1 | 3/2010 | Gronninger et al. | |
| 7,682,454 B2 | 3/2010 | Sneh | |
| 7,794,546 B2 | 9/2010 | Li | |
| 7,845,309 B2 | 12/2010 | Condrashoff et al. | |
| 7,976,898 B2 | 7/2011 | Hong et al. | |
| 7,993,457 B1 | 8/2011 | Krotov et al. | |
| 8,152,922 B2 | 4/2012 | Schmidt et al. | |
| 8,211,230 B2 | 7/2012 | Verghese et al. | |
| 8,282,735 B2 | 10/2012 | Choi et al. | |
| 2001/0042514 A1 | 11/2001 | Mizuno et al. | |
| 2003/0019428 A1 | 1/2003 | Ku et al. | |
| 2003/0079686 A1 | 5/2003 | Chen et al. | |
| 2003/0082301 A1 | 5/2003 | Chen et al. | |
| 2003/0082307 A1 | 5/2003 | Chung et al. | |
| 2003/0106490 A1 | 6/2003 | Jallepally et al. | |
| 2003/0108674 A1 | 6/2003 | Chung et al. | |
| 2003/0121608 A1 | 7/2003 | Chen et al. | |
| 2003/0124262 A1 | 7/2003 | Chen et al. | |
| 2003/0129308 A1 | 7/2003 | Chen et al. | |
| 2003/0150560 A1 | 8/2003 | Kinnard et al. | |
| 2003/0203616 A1 | 10/2003 | Chung et al. | |
| 2004/0009336 A1 | 1/2004 | Marcadal et al. | |
| 2004/0009665 A1 | 1/2004 | Chen et al. | |
| 2004/0048461 A1 | 3/2004 | Chen et al. | |
| 2004/0069227 A1 | 4/2004 | Ku et al. | |
| 2004/0077183 A1 | 4/2004 | Chung | |
| 2004/0099378 A1 | 5/2004 | Kim et al. | |
| 2004/0187304 A1 | 9/2004 | Chen et al. | |
| 2004/0221807 A1 | 11/2004 | Verghese et al. | |
| 2004/0231799 A1 | 11/2004 | Lee et al. | |
| 2004/0241321 A1 | 12/2004 | Ganguli et al. | |
| 2004/0256351 A1 | 12/2004 | Chung et al. | |
| 2004/0266175 A1 | 12/2004 | Chen et al. | |
| 2005/0000449 A1 | 1/2005 | Ishibashi et al. | |
| 2005/0009325 A1 | 1/2005 | Chung et al. | |
| 2005/0011555 A1 | 1/2005 | Maula et al. | |
| 2005/0078953 A1* | 4/2005 | Fodor ................ | C23C 16/4585 392/418 |
| 2006/0065636 A1 | 3/2006 | Babic | |
| 2006/0180082 A1 | 8/2006 | Iwamoto et al. | |
| 2006/0249077 A1 | 11/2006 | Kim et al. | |
| 2009/0136665 A1 | 5/2009 | Choi et al. | |

FOREIGN PATENT DOCUMENTS

| | | |
|---|---|---|
| JP | 2000315720 A2 | 11/2000 |
| JP | 2003-508932 | 3/2003 |

(56) References Cited

FOREIGN PATENT DOCUMENTS

| | | |
|---|---|---|
| JP | 2004-91848 | 3/2004 |
| JP | 2004-538374 | 12/2004 |
| KR | 0319494 | 1/2002 |
| KR | 2004-63893 | 7/2004 |
| WO | WO 01/17692 A1 | 3/2001 |
| WO | WO 03/016587 | 2/2003 |
| WO | WO 03/030243 A1 | 4/2003 |
| WO | WO 2004/025716 A1 | 3/2004 |

OTHER PUBLICATIONS

English Translation of Notice of Reasons for Rejection dated Aug. 29, 2011 for Japanese Patent Application No. 2007-551472.
International Search Report for Application No. PCT/US2006/001640 (the PCT counterpart of the parent application) dated Jun. 19, 2006.
English translation of the Office Action in Taiwan Patent Application No. 95101879, filed Jan. 18, 2006, dated Oct. 26, 2012.
English translation of the Office Action in Japanese Patent Application No. 2011-265435, Filed Jan. 17, 2006, dated Dec. 4, 2012.
English translation of the Office Action in Korean Patent Application No. 10-2007-7018502, Filed Jan. 17, 2006, dated Nov. 19, 2012.
Office Action in Korean Patent Application No. 10-2013-7004189, dated Apr. 24, 2013, filed Feb. 19, 2013.
Office Action in Japanese Patent Application No. 2011-265435, dated Apr. 16, 2013, filed Jan. 17, 2006.
Office Action in Japanese Patent Application No. 2011-265435, filed Jan. 17, 2006, dated Sep. 24, 2013.
Office Action in Korean Patent Application No. 2013-7004189, filed Feb. 19, 2013, dated Nov. 14, 2013.
Office Action in Korean Patent Application No. 10-2013-7004189, dated Feb. 18, 2014, filed Feb. 19, 2013.

* cited by examiner

REACTION SYSTEM FOR GROWING A THIN FILM

RELATED APPLICATIONS

This application claims the benefit of priority under 35 U.S.C. § 120 of U.S. application Ser. No. 13/529,223, filed on Jun. 21, 2012, and of U.S. application Ser. No. 11/333, 127, filed on Jan. 17, 2006, and issued Jul. 3, 2012, as U.S. Pat. No. 8,211,230, and claims the benefit of priority under 35 U.S.C. § 119(e) of Provisional Application No. 60/645, 581, filed on Jan. 18, 2005 and Provisional Application No. 60/656,832, filed Feb. 24, 2005, the entire contents of these applications are hereby incorporated herein by reference in their entirety for all purposes.

BACKGROUND OF THE INVENTION

The present invention relates to equipment for chemical processes. In particular, the present invention relates to equipment for growing a thin film in a reaction chamber.

DESCRIPTION OF THE RELATED ART

There are several vapor deposition methods for depositing thin films on the surface of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE), which is more recently referred to as Atomic Layer Deposition (ALD).

ALD is a known process in the semiconductor industry for forming thin films of materials on substrates such as silicon wafers. ALD is a type of vapor deposition wherein a film is built up through self-saturating reactions performed in cycles. The thickness of the film is determined by the number of cycles performed. In an ALD process, gaseous precursors are supplied, alternatingly and repeatedly, to the substrate or wafer to form a thin film of material on the wafer. One reactant adsorbs in a self-limiting process on the wafer. A subsequent reactant pulse reacts with the adsorbed material to form a single molecular layer of the desired material. Decomposition may occur through reaction with an appropriately selected reagent, such as in a ligand exchange or a gettering reaction. In a typical ALD reaction, no more than a molecular monolayer forms per cycle. Thicker films are produced through repeated growth cycles until the target thickness is achieved.

In an ALD process, one or more substrates with at least one surface to be coated and reactants for forming a desired product are introduced into the reactor or deposition chamber. The one or more substrates are typically placed on a wafer support or susceptor. The wafer support is located inside a chamber defined within the reactor. The wafer is heated to a desired temperature above the condensation temperatures of the reactant gases and below the thermal decomposition temperatures of the reactant gases.

A characteristic feature of ALD is that each reactant is delivered to the substrate in a pulse until a saturated surface condition is reached. As noted above, one reactant typically adsorbs on the substrate surface and a second reactant subsequently reacts with the adsorbed species. As the growth rate is self-limiting, the rate of growth is proportional to the repetition rate of the reaction sequences, rather than to the temperature or flux of reactant as in CVD.

To obtain self-limiting growth, vapor phase reactants are kept separated by purge or other removal steps between sequential reactant pulses. Since growth of the desired material does not occur during the purge step, it can be advantageous to limit the duration of the purge step. A shorter duration purge step can increase the available time for adsorption and reaction of the reactants within the reactor, but because the reactants are often mutually reactive, mixing of the vapor phase reactants should be avoided to reduce the risk of CVD reactions destroying the self-limiting nature of the deposition. Even mixing on shared lines immediately upstream or downstream of the reaction chamber can contaminate the process through parasitic CVD and subsequent particulate generation.

SUMMARY OF THE INVENTION

To prevent the vapor phase reactants from mixing, ALD reactors may include an "inert gas valving" or a "diffusion barrier" arrangement in a portion of a supply conduit to prevent flow of reactant from a reactant source to the reaction chamber during the purge step. Inert gas valving involves forming a gas phase, convective barrier of a gas flowing in the opposite direction to the normal reactant flow in the supply conduit. See T. Suntola, *Handbook of Crystal Growth III, Thin Films and Epitaxy, Part B: Growth Mechanisms and Dynamics*, ch. 14, *Atomic Layer Epitaxy*, edited by D. T. J. Hurle, Elsevier Science V.B. (1994), pp. 601-663, the disclosure of which is incorporated herein by reference. See especially, pp. 624-626. Although such prior art arrangements have been successful in preventing vapor phase reactants from mixing, there is still room for improvement. In particular, experimental studies have indicated that within the reactor chamber there are dead pockets and/or recirculation cells that are difficult to purge. Accordingly, a portion of previous reactant pulse may remain in the reaction chamber during the subsequent reactant pulse. This may disadvantageously lead to CVD growth within the reaction chamber and on the substrate itself. CVD growth within the reaction chamber may disadvantageously lead to increased particle emissions.

A need therefore exists for an improved reactor design which is easier to purge and eliminates or significantly reduces dead pockets in which reactants may remain after a purging step.

Accordingly, one embodiment of the present invention comprises an atomic deposition (ALD) thin film deposition apparatus that includes a deposition chamber configured to deposit a thin film on a wafer mounted within a space defined therein. The deposition chamber comprises a gas inlet that is in communication with the space. A gas system is configured to deliver gas to the gas inlet of the deposition chamber. At least a portion of the gas system is positioned above the deposition chamber. The gas system includes a mixer configured to mix a plurality of gas streams. A transfer member is in fluid communication with the mixer and the gas inlet. The transfer member comprising a pair of horizontally divergent walls configured to spread the gas in a horizontal direction before entering the gas inlet.

Another embodiment of the present invention comprises an atomic layer deposition (ALD) thin film deposition apparatus that comprises a deposition chamber configured to deposit a thin film on a wafer mounted within a space defined therein. The deposition chamber includes a gas inlet that is in communication with the space. The deposition chamber further comprising a sealing portion that includes a sealing surface. A susceptor is configured to support the wafer within the space. The susceptor configured to move vertically with respect to the deposition chamber between a first position in which the susceptor seals against the sealing surface and a second, lower position in which the susceptor no longer seals against the sealing surface. In the first position, a vertical distance between the interface between the sealing surface and the susceptor and the wafer positioned on the susceptor is less than about 2 millimeters.

Another embodiment of the present invention comprises a substrate support for processing semiconductor substrates. The substrate support comprises a top surface with a recess. The recess is configured such that the top surface of the substrate support only contacts the substrate along an edge portion of the substrate.

Another embodiment of the present invention comprises an deposition (ALD) thin film deposition apparatus that includes a deposition chamber configured to deposit a thin film on a wafer mounted within a space defined therein. The deposition chamber comprises a gas inlet that is in communication with the space. The deposition chamber further comprises a sealing portion that includes a sealing surface. A susceptor is configured to support the wafer within the space. The susceptor is configured to move vertically with respect to the deposition chamber between a first position in which the susceptor seals against the sealing surface and a second, lower position in which the susceptor no longer seals against the sealing surface. The susceptor is configured such that when the wafer is positioned on the susceptor in the first position, the leading edge of the wafer, with respect to gas flow, is positioned further from the sealing surface as compared to the trailing edge of the wafer.

These and other objects, together with the advantages thereof over known processes and apparatuses which shall become apparent from the following specification, are accomplished by the invention as hereinafter described and claimed.

DETAILED DESCRIPTION OF THE PREFERRED EMBODIMENTS

Figure 1A:
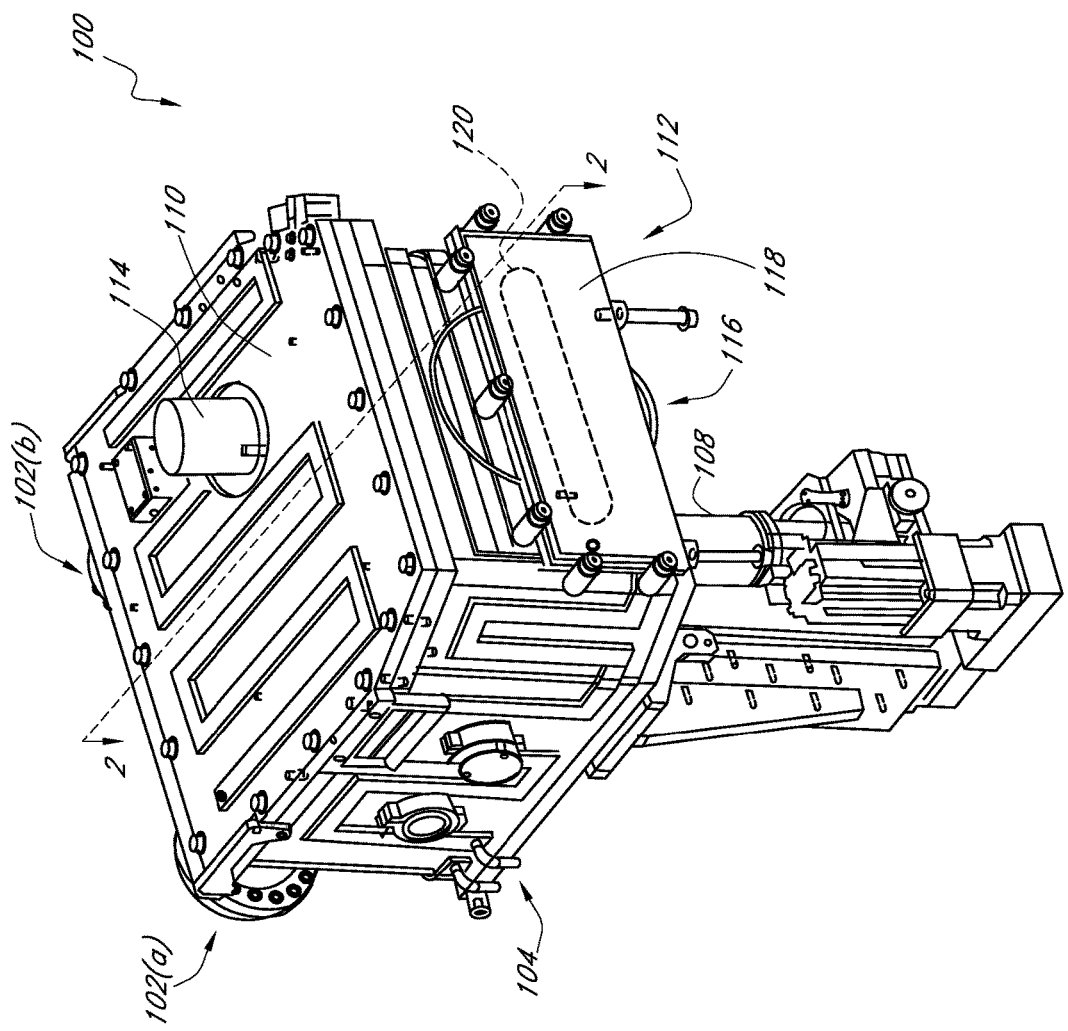
FIG. 1A is front, top and left side a perspective view of an atomic layer deposition (ALD) device.

FIG. 1A is a perspective view of an embodiment of an ALD device 100. The ALD device 100 comprises a top member 110, a bottom member 112, and a front member 118, which together form a portion of a housing for the ALD device 100. In the embodiment illustrated in FIG. 1A, an upper heater 114 extends through the top member 110. The upper heater 114 is configured to maintain the temperature in the upper portion of the ALD device 100. Similarly, a lower heater 116 extends through the bottom member 112. The lower heater is configured to maintain the temperature in the lower portion of the ALD device 100.

The front member 118, which serves as a gate valve, of the ALD device 100 covers an opening 120. A dashed line outlines the opening 120 in FIG. 1A. Once the front member 118 is removed, the opening 120 can receive a wafer to be processed by the ALD device 100. In this way, the received wafer is placed in a deposition chamber within the ALD device 100. Once processing is complete, the wafer can be removed from the deposition chamber via the same opening 120.

An ALD control system (not shown) is configured to control the ALD device 100 during processing of the wafer. For example, the ALD control system can include a computer control system and electrically controlled valves to control the flow of reactant and buffer gases into and out of the ALD device 100. The ALD control system can include modules such as a software or hardware component, such as a FPGA or ASIC, which performs certain tasks. A module may advantageously be configured to reside on the addressable storage medium of the computer control system and be configured to execute on one or more processors.

Figure 1B:
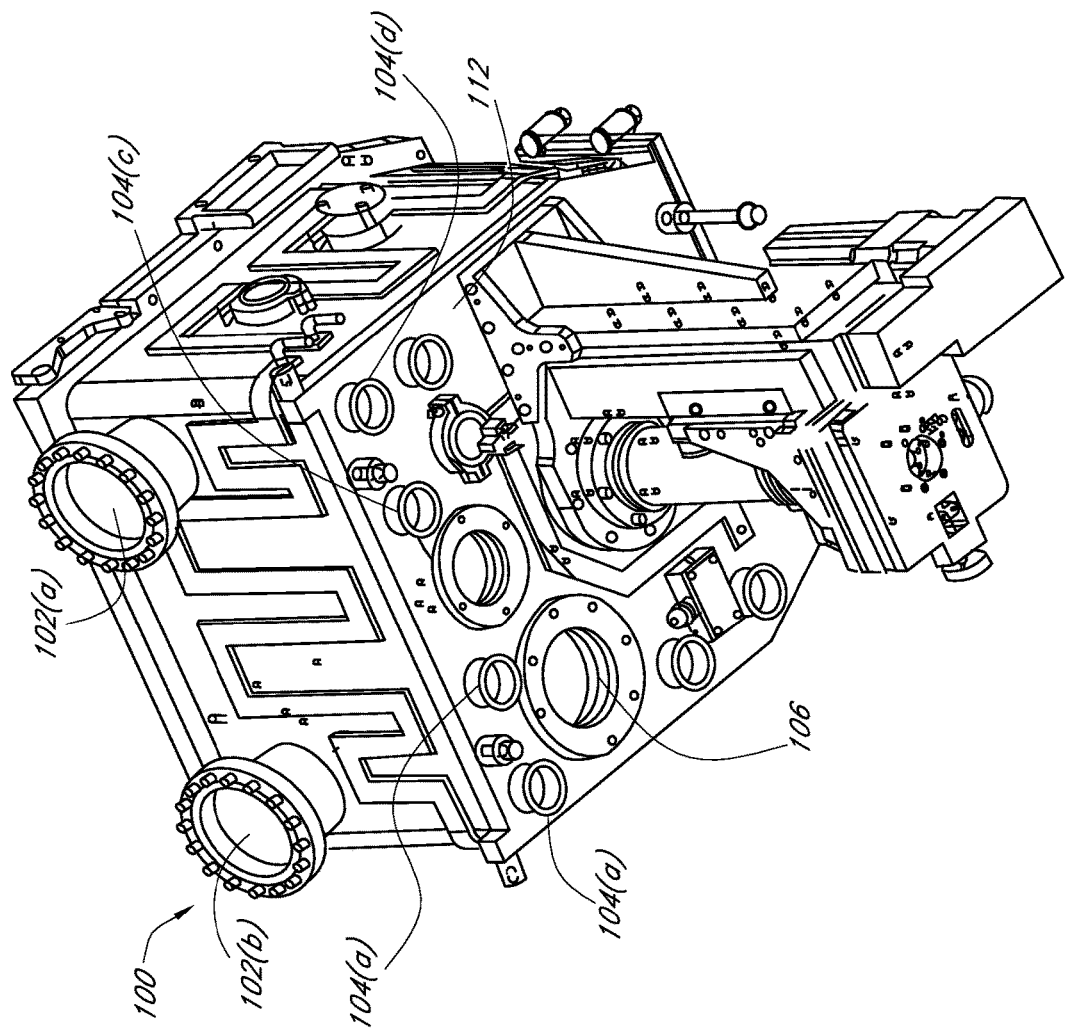
FIG. 1B is a bottom, back and left side perspective view of the ALD device from FIG. 1A.

FIG. 1B is a perspective view of the ALD device 100 showing the bottom member 112. The ALD device 100 further comprises a set of couplings 102(*a*), 102(*b*), 104(*a*)-(*d*). In this exemplary configuration, ALD device 100 includes four separate reactant vapor sources. Two of these reactant vapor sources are connected to the ALD device 100 via couplings 102(*a*), 102(*b*). These gas sources can be pressurized or not. These vapor sources can be, for example, solid sublimation vessels, liquid bubblers or gas bombs. The third and fourth reactant vapor sources are connected to the ALD device 100 via couplings 104(*b*), 104(*c*).

In one embodiment, each reactant vapor source has an associated inert gas source, which can be used to purge the reactant vapor lines after pulsing the reactant. For example, the inert gas sources that are associated with the reactant vapor sources connected to couplings 102(*a*) and 102(*b*) can be connected to couplings 104(*a*) and 104(*d*), respectively.

The inert gas sources associated with the reactant vapor sources connected to couplings 104(b) and 104(c) can also connected to couplings 104(b) and 104(c), respectively. These inert gas sources can be pressurized or not. These inert gas sources can, be, for example, noble or nitrogen gas sources. The ALD control system (not shown) controls one or more valves to selectively allow or prevent the various gases from reaching the ALD device 100.

The ALD device 100 can be configured to deposit a thin film on the wafer when the wafer is inserted in the deposition chamber. In general, the ALD device 100 can receive a first reactant gas via one of the couplings 102(a), 102(b) or one of the couplings 104(b), 104(c). The ALD device 100 can also receive inert gas via the couplings 104(a)-104(d). In one embodiment, the inert gas enters the deposition chamber with the first reactant gas to adsorb no more than a monolayer of the first reactant on the wafer. By switching the appropriate valves (not shown), the flow of the first reactant gas is stopped preferably via an inert gas valving (IGV) arrangement and the deposition chamber and the gas lines are then purged with the inert gas from couplings 104(a), 104(b), 104(c), and 104(d). After the deposition chamber and gas lines are purged, the deposition cycle is continued with one or more of the other reactant gases. In one embodiment, the reactants from alternated pulses react with each other on the substrate or wafer surface to form no more than a single monolayer of the desired product in each cycle. It should be noted that variations of true ALD operation can increase deposition speed above one monolayer per cycle with some sacrifice to uniformity.

In embodiments of the ALD device 100, more than two reactant gases can be sequentially flowed (separated by periods of purging) through the ALD device 100 in each cycle to form compound materials on the wafer. Excess of each reactant gas can be subsequently exhausted via gas exit 106 (FIG. 1B) after adsorbing or reacting in the deposition chamber. The gas exit 106 may be connected to a vacuum pump to assist in the removal of the gases from the deposition chamber and provide a low pressure condition in the deposition chamber. Furthermore, the entire ALD device 100 can be pumped down to a low pressure by connecting any of the other couplings on the bottom member 112 to a vacuum pump.

Figure 2:
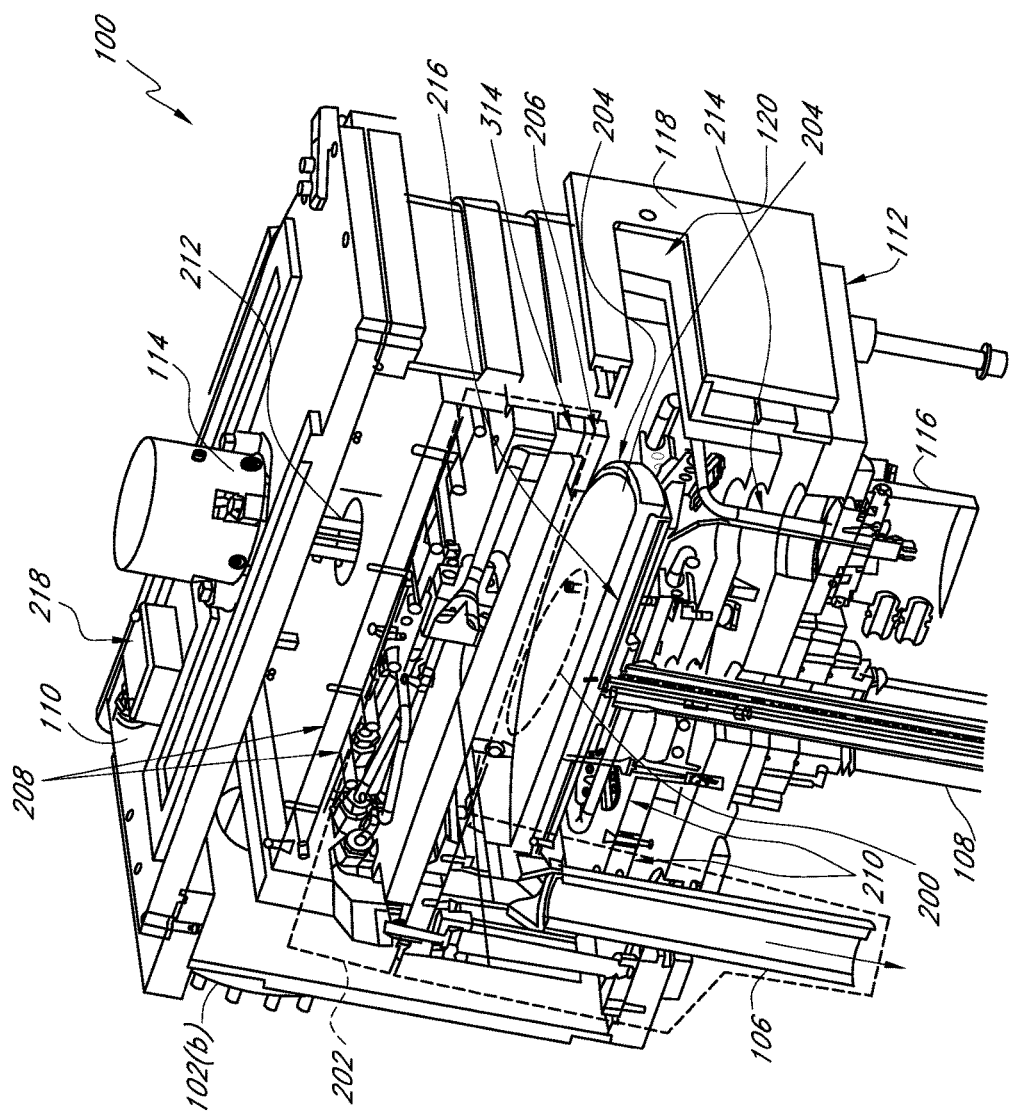
FIG. 2 is a cut-away perspective of the ALD device of FIG. 1, cut along lines 2-2.

FIG. 2 is a cut-away section view of the ALD device 100 from FIG. 1A taken along line 2-2. Within the ALD device 100 is a gas distribution system 202 (shown in more detail in FIG. 4) and a deposition chamber 200, which is formed by a top or cover plate 314, bottom or base plate 206, susceptor or wafer support 204 and exhaust launder 316. Located on upper and lower sides of the gas distribution system 202 and the deposition chamber 200 are one or more reflector plates 208, 210. The ALD device 100 further includes a wafer support 204, a wafer support heater 216, and a thermal switch 218.

The wafer support 204 is located within the ALD device and is configured to support a substrate or wafer during the deposition process. The wafer support 204 can be adapted to rotate within the deposition chamber 200. The wafer support heater 216 can be configured to heat the wafer support 204. The thermal switch 218 can be provided on the top member 110. The thermal switch 218 can be configured to monitor the temperature of the top member 110. It will be understood that the system 100 includes other temperature sensor and control mechanisms to maintain various surfaces of the system at desired temperatures.

The illustrated embodiment includes upper reflector plates 208 that provide a thermal barrier between the upper portion of the gas distribution system 202 and the top member 110. Similarly, lower reflector plates 210 provide a thermal barrier between the lower portion of the deposition chamber 200 and the bottom member 112. The reflector plates 208 and 210 are also used to assist in radiatively heating the deposition chamber within a low pressure environment. As illustrated in FIG. 2, the upper heater 114 is coupled to coils 212 which extend through the upper reflector plates 208. The coils 212 are configured to provide heat through radiation to the upper portion of the gas distribution system 202. Similarly, the lower heater 116 is coupled to coils 214 which extend through the lower reflector plates 210 and heat the lower portion of the deposition chamber 200. Alternatively, other heating systems can be employed.

The gas distribution system 202 is configured to route reactant gases entering via the couplings 102(a), 102(b), 104(b), 104(c) and inert gases entering via couplings 104(a)-(d) through the ALD device 100 (see FIG. 1B). The gas distribution system 202 is further configured to selectively mix one or more of the inert gases entering via couplings 104(a)-(d) with one of reactant gases entering via couplings 102(a), 102(b), 104(b), 104(c) during a given pulse. The resulting mixture enters the deposition chamber 200. After each pulse, the gas distribution system 202 exhausts any unreacted reactant and inert gases from the deposition chamber via gas exit 106, such as through purging. The term coupling is used to describe a gas flow connection between one or more gas lines. The locations of the couplings shown herein are for illustrative purposes only and can be located at different locations along a gas line. Moreover, a gas line associated with a given coupling can be configured to flow gas into or out of the gas distribution system 202. As will be described below, the various couplings in the exemplary embodiments described herein are designated to flow gases into or out of the gas distribution system 202. However, the invention is not limited to the exemplary embodiments disclosed herein.

The order that the reactant gases are cycled through the ALD device 100 depends on the desired product. To minimize any interaction between one or more reactant gases prior to each gas entering the deposition chamber 200, the inert gas entering via couplings 104(a)-(d) is periodically cycled or continuously flowed through the ALD device 100 between pulses of the reactant gases. In this way, the inert gases purge the deposition chamber 200. As will be explained below, various reactant gases and inert gases are systematically cycled through the ALD device 100 so as to form a deposit on the wafer inserted through the opening 120.

Figure 3:
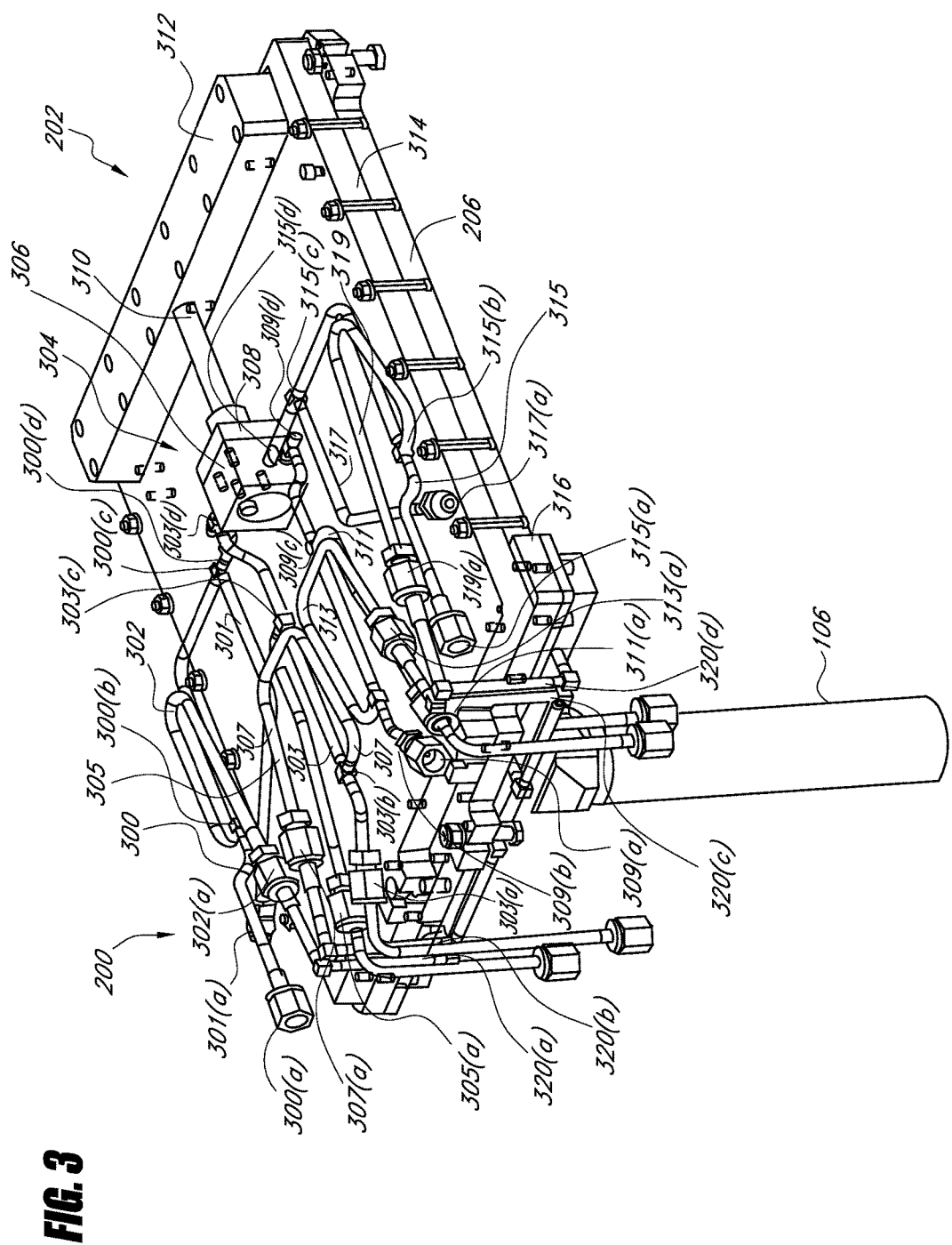
FIG. 3 is a perspective view of the gas distribution system within the ALD device of FIG. 1A (partially visible in FIG. 2).

FIG. 3 is a perspective view of the deposition chamber 200 and the gas distribution system 202 from the ALD device 100 of FIG. 1A. The gas distribution system 202 comprises a plurality of gas lines, a mixer assembly 304, a transfer tube 310, and an intake plenum or manifold 312. The deposition chamber 200 includes a cover plate 314, a base plate 206, and an exhaust launder 316. The gas distribution system 202 is connected to the deposition chamber 200 at the intake plenum 312

Figure 4:
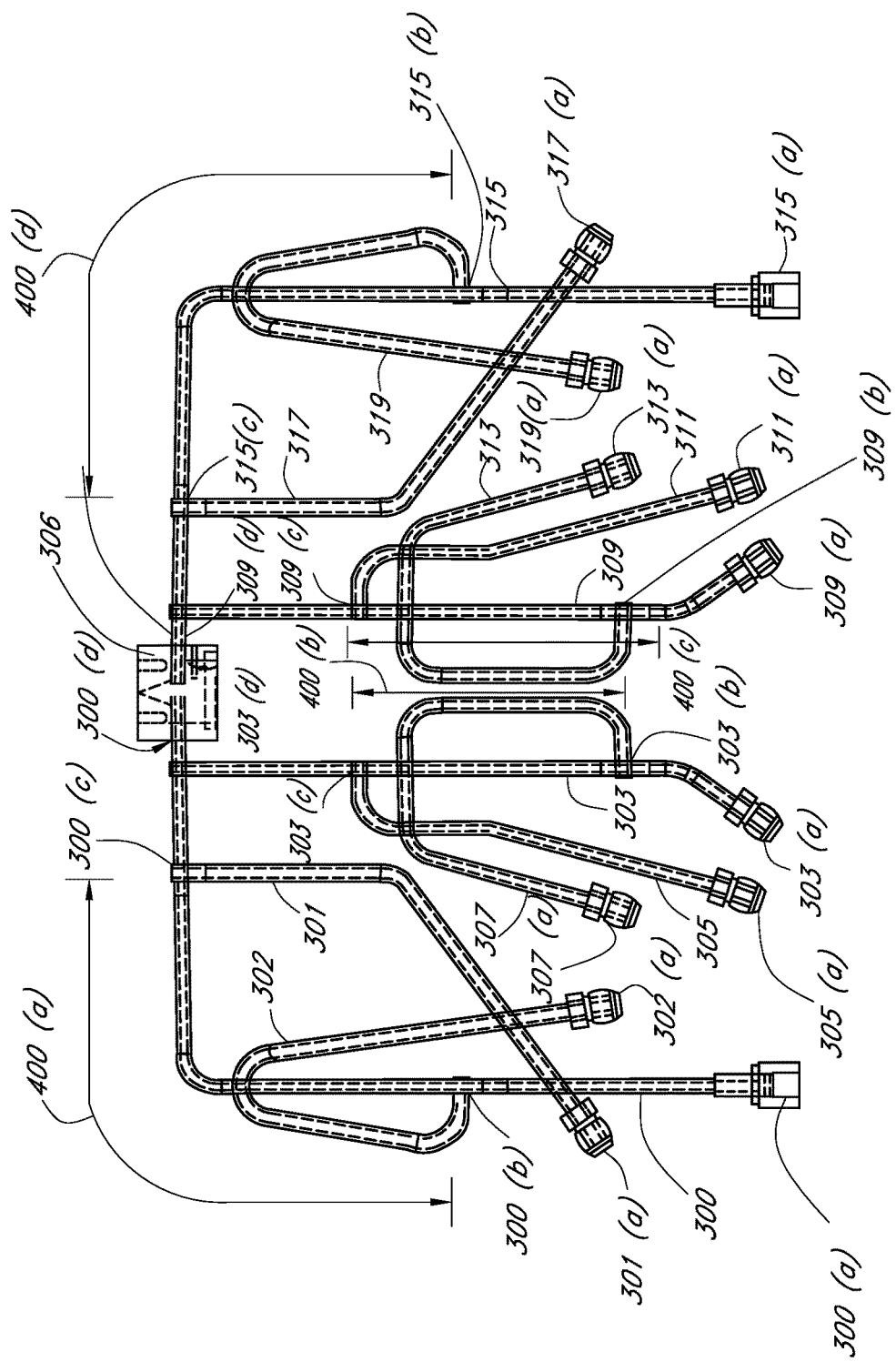
FIG. 4 is a top plan view of the reactant gas lines coupled to an upstream member of the mixer assembly of the gas distribution system from FIG. 3 showing a buffer region in each reactant gas line.

As best seen in FIG. 4, in this example, the plurality of gas lines include four reactant lines 300, 303, 309, 315 and eight buffer lines 301, 302, 305, 307, 311, 313, 317, and 319. Each reactant line is coupled with two of the buffer lines. Reactant line 300 is coupled to buffer lines 301, 302. Reactant line 303 is coupled to buffer lines 305, 307. Reactant line 307 is coupled to buffer lines 311, 313. Reactant line 315 is coupled to buffer lines 317, 319. The gas distribution system 202 can include greater or fewer reactant lines and buffer lines depending on the configuration of the ALD device 100. Moreover, each reactant line may or may not be coupled to two buffer lines. For example, one or more of the reactant lines may be coupled to the buffer lines while another reactant line is not. The reactant line that is not coupled to buffer lines could be shut off by other means.

Each reactant gas line includes four couplings within the gas distribution system 202. Reactant gas line 300 comprises couplings 300(a), 300(b), 300(c), and 300(d). Reactant gas line 303 comprises couplings 303(a), 303(b), 303(c), and 303(d). Reactant gas line 309 comprises couplings 309(a), 309(b), 309(c), and 309(d). Reactant gas line 315 comprises couplings 315(a), 315(b), 315(c), and 315(d). The couplings for each reactant gas line are described below.

Coupling 300(a) couples the reactant gas line 300 with the coupling 102(b) that leads to a reactant source (see FIG. 1B). Coupling 300(b) couples the reactant gas line 300 with the buffer line 302. Coupling 300(c) couples the reactant gas line 300 with the buffer line 301. Coupling 300(d) couples the reactant gas line 300 with the mixer assembly 304.

Coupling 303(a) couples the reactant gas line 303 with the coupling 104(b) that leads to another reactant source (see FIG. 1B). Coupling 303(b) couples the reactant gas line 303 with the buffer line 307. Coupling 303(c) couples the reactant gas line 303 with the buffer line 305. Coupling 303(d) couples the reactant gas line 303 with the mixer assembly 304.

Coupling 309(a) couples the reactant gas line 309 with the coupling 104(c) that leads to another reactant source. (see FIG. 1B). Coupling 309(b) couples the reactant gas line 309 with the buffer line 313. Coupling 309(c) couples the reactant gas line 309 with the buffer line 311. Coupling 309(d) couples the reactant gas line 309 with the mixer assembly 304.

Coupling 315(a) couples the reactant gas line 315 with the coupling source 102(a) that leads to still another reactant source (see FIG. 1B). Coupling 315(b) couples the reactant gas line 315 with the buffer line 319. Coupling 315(c) couples the reactant gas line 315 with the buffer line 317. Coupling 315(d) couples the reactant gas line 315 with the mixer assembly 304.

Buffer lines 301, 302, 305, 307, 311, 313, 317, and 319 comprise couplings 301(a), 302(a), 305(a), 307(a), 311(a), 313(a), 317(a), and 319(a), respectively.

In the embodiment illustrated in FIGS. 3 and 4, each coupling 301(a), 305(a), 311(a), and 317(a) provides a flow path into the gas distribution system 202. The coupling 301(a) couples the buffer line 301 with the coupling 104(a) (see FIG. 1B). The coupling 305(a) couples the buffer line 305 with the coupling 104(b) (see FIG. 1B). The coupling 311(a) couples the buffer line 311 with the coupling 104(c) (see FIG. 1B). The coupling 317(a) couples the buffer line 317 with the coupling 104(d) (see FIG. 1B).

Each coupling 302(a), 307(a), 313(a), and 319(a) provides a flow path between the gas distribution system 202 and the exhaust launder 316 via connectors 320(a)-(d). Connector 320(a) connects coupling 302(a) with the exhaust launder 316. Connector 320(b) connects coupling 307(a) with the exhaust launder 316. Connector 320(c) connects coupling 313(a) with the exhaust launder 316. Connector 320(d) connects coupling 319(a) with the exhaust launder 316. These connections contribute to the operation of inert gas valving (IGV).

In the embodiment shown in FIG. 3, the reactant gas lines 300, 303, 309, and 315 route reactant gases to the mixer assembly 304. The buffer lines 301, 305, 311, and 317 route inert gases to the mixer assembly 304. The resulting mixture (one reactant at a time with an inert gas) flows through a transfer tube 310 to an intake plenum 312. The intake plenum 312 distributes the mixture in a transverse direction with respect to the flow path through the transfer tube 310. The mixture exits the intake plenum 312 into the deposition chamber 200 through the cover plate 314. As shown in FIGS. 2 and 3, the cover plate 314 lies adjacent to the base plate 206 and the two plates form a flow path there between for the mixture to flow over the substrate or wafer placed on the wafer support 204. The base plate 206 and the cover plate 314 have substantially rectangular outer perimeters.

While traversing the deposition chamber 200, the mixture pulse saturates the surface of the substrate. Adsorption or reaction occurs between the current mixture and the surface of the substrate as left by the previous pulse may occur. After passing through the deposition chamber 200, the mixture flows towards the exhaust launder 316. The exhaust launder 316 is configured to collect excess of the mixture and any byproduct after the mixture has saturated the wafer. In an embodiment, a region within the exhaust launder 316 is at a lower pressure than the pressure in the deposition chamber 200. A negative pressure source or vacuum can be in flow communication with the exhaust launder 316 and/or gas exit 106 to draw the mixture from the deposition chamber 200. The exhaust launder 316 is in flow communication with the gas exit 106. The collected mixture exits the deposition chamber 200 via the gas exit 106.

Still referring to FIG. 3, the mixer assembly 304 includes an upstream member 306 and a downstream member 308. The upstream member 306 is in flow communication with the reactant gas lines and the buffer lines. The upstream member 306 is configured to mix the reactant gas with the inert gas prior to the mixture entering the downstream member 308. The downstream member 308 funnels the mixture between the upstream member 306 and the transfer tube 310 the downstream member 308 is generally configured to minimize the tendency of the mixture to re-circulate within the downstream member 308 by continually reducing cross-sectional area of the flow path for the mixture.

FIG. 4 is a top plan view of the reactant gas lines coupled to the buffer lines and the upstream member 306 of the mixer assembly. Between couplings 300(c) and 300(b), a buffer region 400(a) is formed in the reactant gas line 300. Between couplings 303(c) and 303(b), a buffer region 400(b) is formed in the reactant gas line 303. Between couplings 309(c) and 309(b), a buffer region 400(c) is formed in the reactant gas line 309. Between couplings 315(c) and 315(b), a buffer region 400(d) is formed in the reactant gas line 315. The buffer lines 301, 305, 311, and 317, which form flow paths into the gas distribution system 202, couple to their associated gas lines downstream of couplings 300(b) 303(b), 309(b), and 315(b). In this way, gas entering via couplings 301(a), 305(a), 311(a), and 317(a) enters the reactant lines 300, 303, 309, 315 downstream of the reactant lines couplings with the buffer lines 302, 307, 311, and 319. Fixed orifices can be placed at couplings 302(a), 307(a), 313(a) and 319(a).

As seen in FIG. 3, couplings 302(a), 307(a), 313(a) and 319(a) are in communication with the exhaust launder 316. The orifices create a higher resistance path for the gases to flow to the exhaust launder 316 and bypass the deposition chamber 200. In this way, during the pulse of a reactant gas, a small portion of the reactant gas entering via couplings 300(a), 303(a), 309(a) or 315(a) bypasses the deposition chamber and flows directly to the exhaust launder 316. The restriction created by the orifice limits the amount of shunted reactant. During the purge step, at least a portion of the inert gas entering via couplings 301(a), 305(a), 311(a), and 317(a) creates a reverse flow towards couplings 300(b) 303(b), 309(b), and 315(b) to form the buffer regions 400 (a)-(d) within the reactant gas line. The buffer regions keep the reactant gases from diffusing into the reactor during the purge steps or during reactant flow of a reactant from one of the other reactant lines into the mixer assembly 304.

For example, during an ALD processing step, reactant gas flows through reactant line 300 towards the upstream member 306 of the mixer assembly. A small amount of this reactant gas is diverted to the buffer line 302 and out through coupling 302(a) into the exhaust launder 316. The amount of gas that is diverted to the buffer line is dependent of the size of the fixed orifice at coupling 302(a). The size of the fixed orifice can be changed to divert more or less of the gas into the exhaust launder 316. The remaining reactant gas flows through the buffer region 400(a) to the coupling 300(c).

Inert gas may or may not be introduced through coupling 301(a) to push the reactant gas into the upstream member 306. If inert gas is introduced through coupling 301(a), the inert gas joins the reactant gas at coupling 300(c) and flows to the upstream member 306. After the pulse step, the reactant gas is purged from the gas line. Purging of the gas line can be accomplished by, for example, shutting off the flow of the reactant gas from coupling 300(a) and/or using the inert gas to impede the diffusion of any remaining reactant gas into the upstream member 306. The shutoff valve can be located outside of the heated area and can be used to shut off the flow of the reactant gas. The inert gas can be introduced through coupling 301(a) in an inert gas valving (IGV) process as described generally in U.S. patent publication number 2001/0054377, published on Dec. 27, 2001, the disclosure of which is hereby incorporated herein by reference.

A first portion of the stream of inert gas flow enters the buffer region 400(a) and flows upstream or backwards towards the coupling 300(b). A second portion of the stream of gas flows downstream towards the upstream member 306. The first portion exits the reactant line 300 at the end of the buffer region 400(a) and enters the buffer line 302. While the first portion is flowing through the buffer region 400(a), the remaining reactant gas between the shutoff valve upstream of coupling 300(a) and coupling 300(b) is blocked from flowing or diffusing to the upstream member 306 without subjecting physical valves (which are remote) to the wear caused by high temperatures. The first portion forms a buffer or diffusion barrier (or inert gas valve) that impedes the flow of the reactant gas through the reactant line 300 to the mixer assembly 304. By cycling the shutoff valve upstream of coupling 300(a), the ALD control system is able to control between flowing and not flowing the inert gas in the buffer line 301. In this way, the ALD control system is able to quickly control whether the reactant gas entering the reactant line 300 via coupling 300(a) reaches the upstream member 306. Furthermore, during the purge step and subsequent pulses of other reactant gases, the reactant gas in a "dead space" which is located between the shutoff valve upstream of the coupling 300(a) and coupling 300(b) can be kept from diffusing into the upstream member 306. This may be advantageous for ALD since the different reactant gases are kept separated and only react on the surface of the substrate and not in the gas phase.

Whether the reactant gas entering the gas distribution system 202 via the coupling 303(a) reaches the upstream member 306 is similarly controlled by flowing a gas through the buffer line 305 and into the reactant line 303 at coupling 303(c) and using a shutoff valve upstream of coupling 303(a). A first portion of the gas entering the reactant line at coupling 303(c) forms the buffer 400(b). In this way, the first portion of the gas impedes the reactant gas entering via the reactant line 303 from entering the upstream member 306. A second portion of the gas entering the reactant line at coupling 303(c) flows away from the buffer region 400(b) and towards the upstream member 306.

Whether the reactant gas entering the gas distribution system 202 via the coupling 309(a) reaches the upstream member 306 is similarly controlled by flowing a gas through the buffer line 311 and into the reactant line 309 at coupling 309(c) and using a shutoff valve upstream of coupling 309(a). A first portion of the gas entering the reactant line at coupling 309(c) forms the buffer 400(c). In this way, the first portion of the gas impedes the reactant gas entering via the reactant line 309 from entering the upstream member 306. A second portion of the gas entering the reactant line at coupling 309(c) flows away from the buffer region 400(c) and towards the upstream member 306.

Whether the reactant gas entering the gas distribution system 202 via the coupling 315(a) reaches the upstream member 306 is similarly controlled by flowing a gas through the buffer line 317 and into the reactant line 315 at coupling 315(c) and a shutoff valve upstream of coupling 315(a). A first portion of the gas entering the reactant line at coupling 315(c) forms the buffer 400(d). In this way, the first portion of the gas impedes the reactant gas entering via the reactant line 315 from entering the upstream member 306. A second portion of the gas entering the reactant line at coupling 315(c) flows away from the buffer region 400(d) and towards the upstream member 306.

As mentioned above, the first portions of the gases which enter the gas distribution system 202 via buffer lines 301, 305, 311, and 317 and form the buffer regions 400(a)-(d), exit via buffer lines 302, 307, 313, and 319. The gas exiting via buffer lines 302, 307, 313, and 319 enter the exhaust launder 316 without passing through the deposition chamber 200. In this way, the first portions of the inert gases bypass the deposition chamber 200 and are collected by the exhaust launder 316 downstream of the deposition chamber 200.

As mentioned above, the second portions of each gas which enter the gas distribution system 202 via buffer lines 301, 305, 311, and 317 flow away from the buffer regions 400(a)-(d) and enter the mixer assembly 304. During reactant pulses, the second portions mix with one or more reactant gases from other reactant lines, which reach the mixer assembly 304. Thus, the second portions flow through the deposition chamber 200. Depending on the current ALD processing step, gases may periodically flow through their respective buffer lines 301, 305, 311, and 317.

A reactant gas which the ALD control system desires to reach the deposition chamber 200 flows through its respective reactant line and into the mixer assembly 304. The ALD control system forms buffer regions 400 in the reactant lines associated with the reactant gases which the ALD control system does not want to reach the deposition chamber 200. The reactant gas which flows through the reactant line which does not have a buffer region 400 mixes with the second portions of the one or more inert gases which are simultaneously flowing through the other reactant lines and into the mixer assembly 304. As explained above, the first portions of these gases form buffer regions in the other reactant lines and bypass the deposition chamber 200.

In one embodiment of the ALD device 100 which comprises four reactant gas lines, each reactant gas alternates in reaching the mixer assembly 304. In this embodiment the reactant gas selected by ALD control system flows into the mixer assembly 304 while inert or "buffer" gas flows in the remaining three reactant lines. Continuing with this embodiment, the second portions of the gases flowing away from the buffer regions enter the mixer assembly 304. The reactant gas of the pulse of interest then mixes with the inert gas of the second portions in the mixer assembly 304.

Further aspects and feature of the illustrated embodiment of the ALD device 100 can be found in U.S. patent application Ser. No. 10/841,585, filed May 7, 2004, the entirety of which is hereby incorporated by reference herein.

Figure 5:
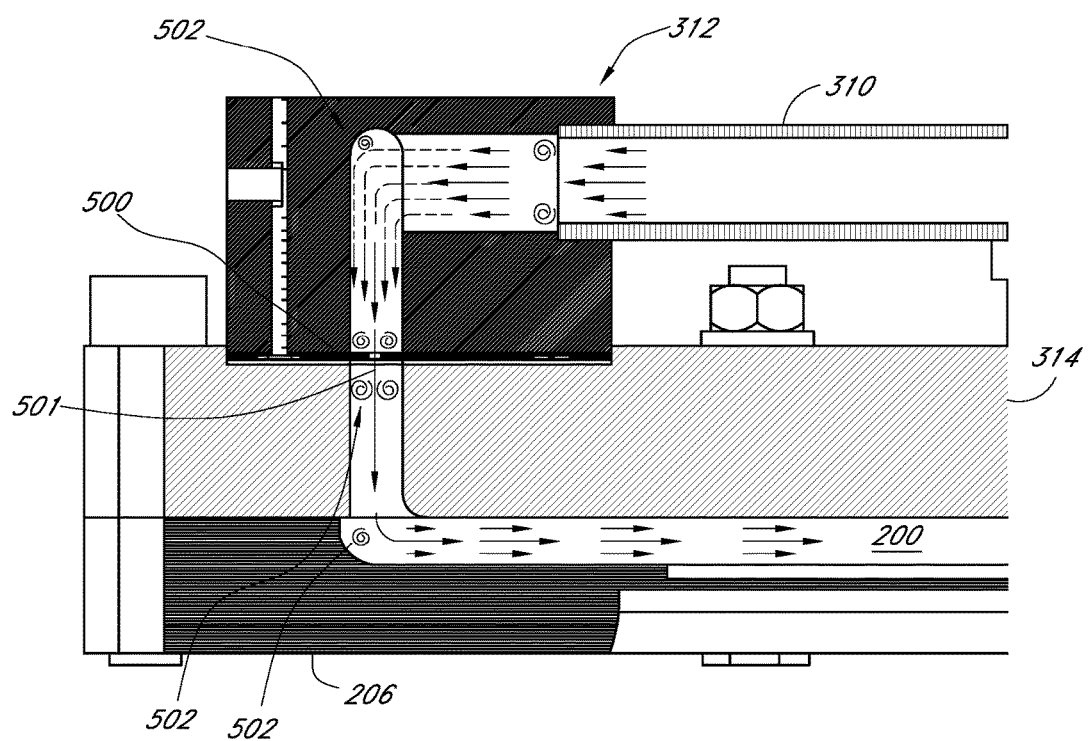
FIG. 5 is a schematic cross-sectional view through a portion of the gas-distribution system and reactor chamber of the ALD device of FIG. 1A.

FIG. 5 is a cross-sectional view of an embodiment of the transfer tube 310, the plenum 312, the top plate 314 and the bottom plate 206 described above. In particular, this figure shows the gas path from the mixer assembly 304 to the deposition chamber 200. As shown in FIG. 5, a shim 500 can be positioned between the plenum 312 and the top plate 314. The shim 500 can be provided with a series of small injection holes 501, which are provided to create sufficient back pressure in the plenum 312 to provide uniform flow across the deposition chamber 200. However, as shown in FIG. 5, this design can result in numerous recirculation cells 502 between the deposition chamber 200 and transfer tube 310. Within these recirculation cells 502, reactants from the subsequent pulses may collect. This may lead to CVD deposition within the deposition chamber 200. Such CVD deposition is generally undesirable and can lead to particle buildup within the deposition chamber 200. In addition, the shim 500 can produce a sharp contraction and then expansion of the gas flow. This can cause a sharp decrease in the temperature of the gas leading to condensation of the precursors in the gas stream.

Figure 6:
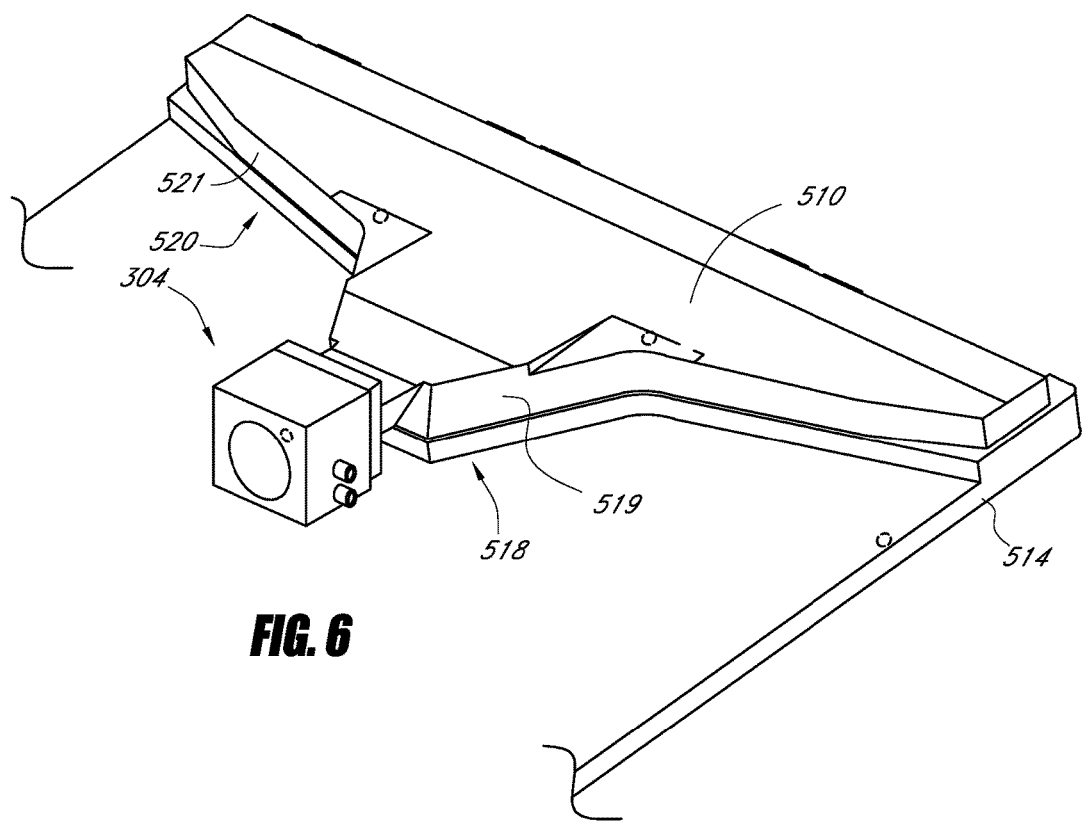
FIG. 6 is a perspective view of a portion of a modified embodiment of a gas distribution system that is coupled to a top plate of a reaction chamber within an ALD device.
Figure 7:
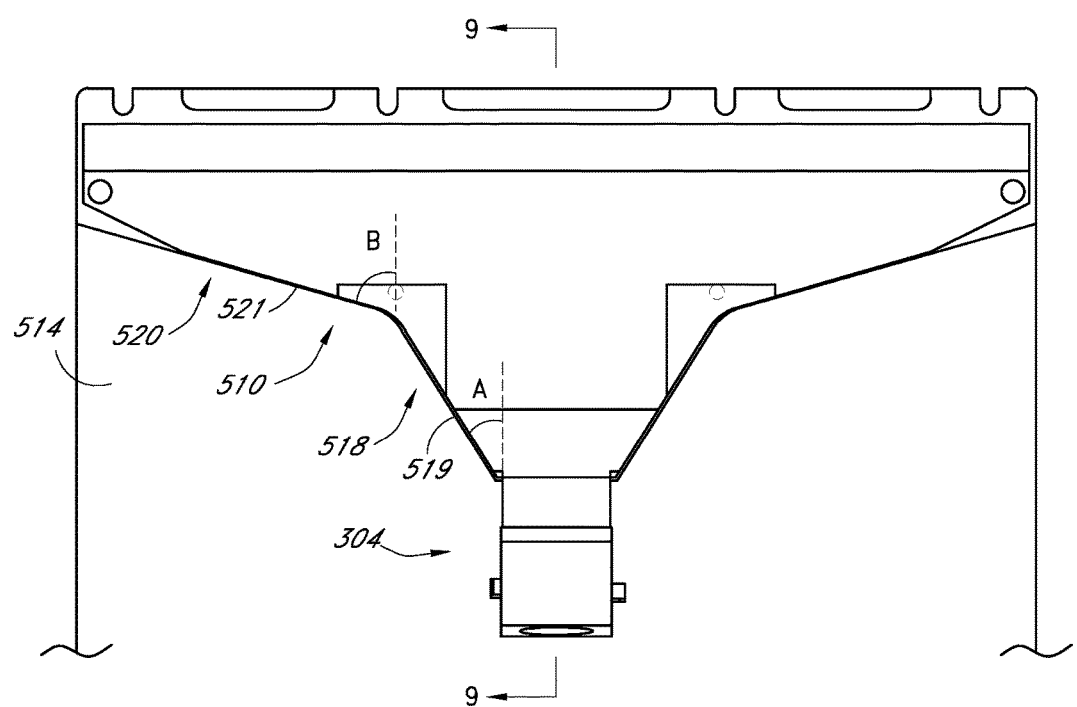
FIG. 7 is a top plan view of the gas distribution system of FIG. 6.
Figure 8:
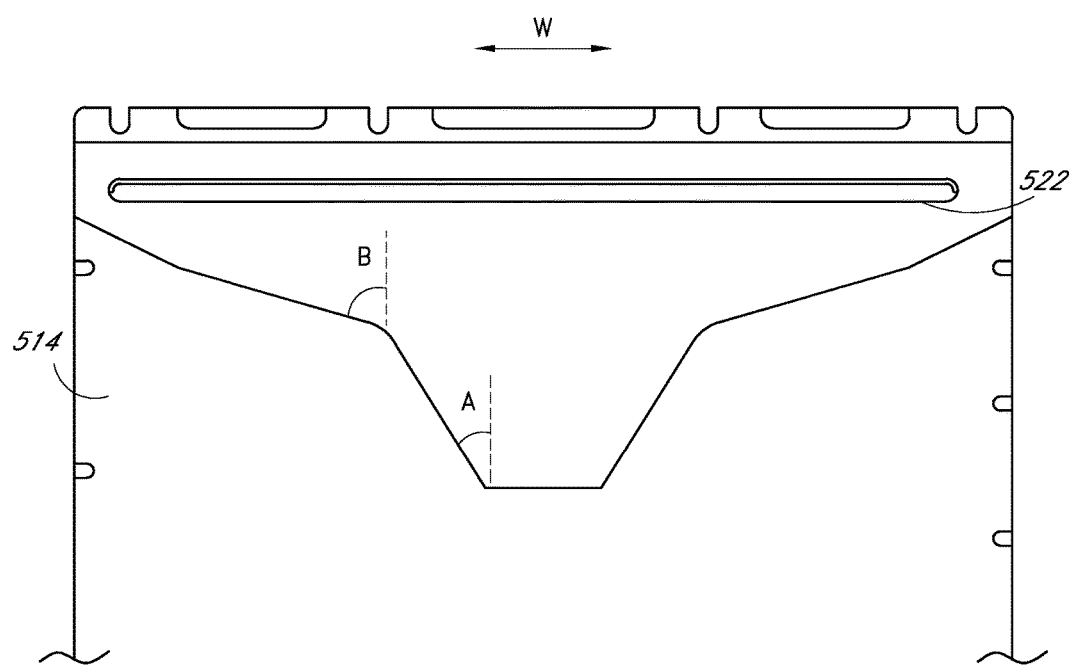
FIG. 8 is a top plan view of the top plate of FIG. 6 with the gas distribution system removed.
Figure 9:
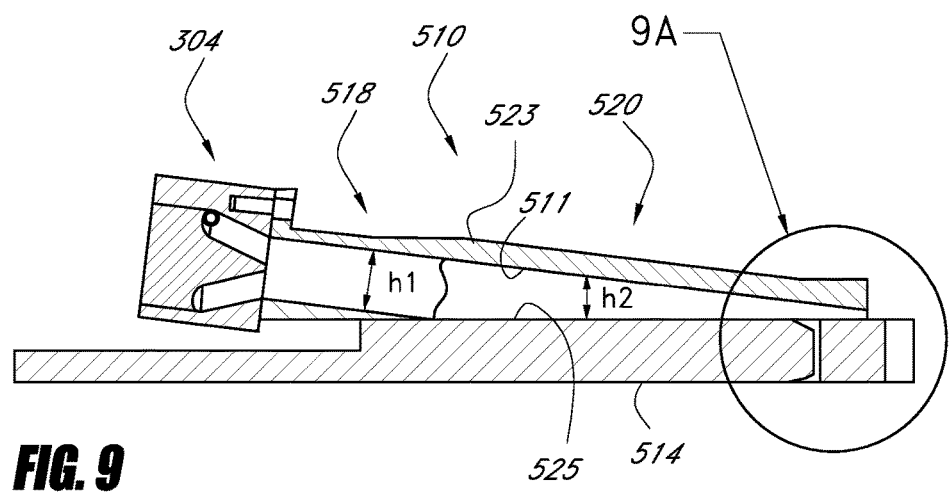
FIG. 9 is a cross-sectional view taken along line 9-9 of FIG. 7.
Figure 9A:
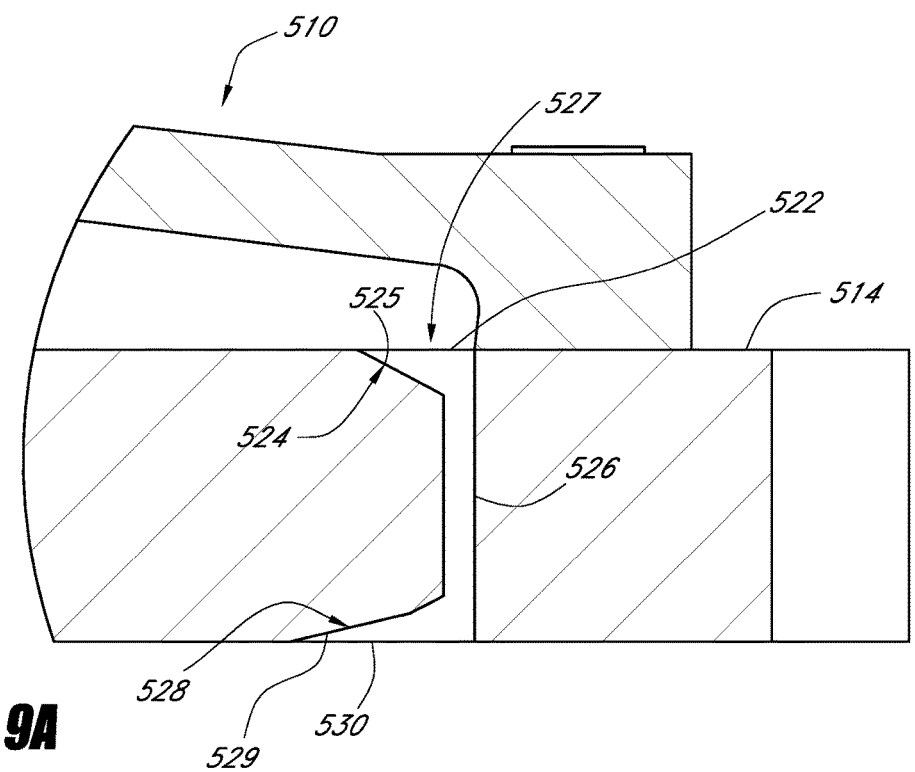
FIG. 9A is an enlarged view of a portion of FIG. 9.

FIGS. 6-9A illustrate an embodiment of a transfer member 510 and top (cover) plate 514. This embodiment seeks to reduce or eliminate the recirculation cells in the gas path by smoothing out the expansion and contraction of the gas flow. FIGS. 6 and 7 are top perspective and plan views of the transfer member 510 and the top plate 514, respectively. FIG. 8 is a top plan view of the top plate 514 with the transfer member 510 removed. FIG. 9 is a cross-sectional view taken through line 9-9 of FIG. 7 and FIG. 9A is an enlarged view of a portion of FIG. 9.

As shown, the transfer member 510 forms a generally triangular shaped flow path that provides for gradual expansion of the gas from the mixer 304. As best seen in FIGS. 8-9, the transfer member 510 in the illustrated embodiment includes a first portion 518 that is generally adjacent to the mixer 304 and a second portion 520 that is generally adjacent an opening 522 in the top plate 514. As shown in FIGS. 7 and 8, the first portion 518 includes a pair of horizontally divergent walls 519 that expand in the horizontal direction at an angle A while the second portion 520 includes a pair of horizontally divergent walls 521 that expand in the horizontal direction at an angle B. In one embodiment, angle B is larger than angle A. In one embodiment, A is between about 5 to 45 degrees and B is between about 30 to 75 degrees. In the illustrated embodiment, the horizontally divergent walls are substantially straight. However, in a modified embodiment, the horizontally divergent walls can be curved, arced, continuously varying and/or segmented. In such an embodiment, the divergent walls can have average or mean divergent angle in the ranges described above.

As shown in FIG. 9, the transfer member 510 includes a top wall 523 which defines, in part, the height of a gas passage 511 defined by the walls 519, 521, the top wall 523 and a top surface 525 of the top plate 514. In one embodiment, in the first portion 518, the height h1 of a gas passage 511 is preferably substantially constant. In the second portion 520, the height h2 of the gas passage 511 gradually decreases in the direction of the gas flow. In this manner, the volume of the second portion 520 adjacent the opening 522 can be reduced as compared to the plenum 312 of FIG. 5. In addition, as the transfer member 510 expands in the horizontal direction, the height of the gas path is reduced to smooth out the expansion of the gas flow and increase back pressure which aid in spreading the gas flow across the chamber width. In the illustrated embodiment, the gas path defined by the passage 211 is generally parallel and opposite to the gas path in the deposition chamber 200 (see e.g., FIG. 11).

Another advantage of the illustrated embodiment is that the gas passage 511 is formed between the transfer member 510 and a top surface 525 of the top plate 514. This "clamshell" arrangement makes it easier to clean and refurbish the transfer member 511 as compared, for example, to a tube. Specifically, when removed from the top plate 514, a large opening is created, which exposes the inner surfaces of the transfer member 511 facilitating cleaning and refurbishing.

With reference now to FIGS. 8, 9 and 9A, the top plate 514 is provided with the opening 522 to receive gas from transfer member 510. In one embodiment, the opening 522 has a cross-sectional area that is substantially equal to the cross-sectional area (with respect to gas flow) of the end of the second portion 520. In this manner, a smooth gas flow from the transfer member 510 into the top plate 514 is promoted. The opening 522 can have a generally elongated rectangular shape. See FIG. 8.

As shown in FIG. 9A, from the opening 522, the top plate 514 includes a gas inlet 527 comprising a gradual contraction portion 524 that is connected to a narrowed region 526. The contraction portion 524 includes a tapered or sloped wall 525, which gradually reduces the cross-sectional area of the gas flow. In the illustrate embodiment, the narrowed region 526 comprises a generally rectangular slit of substantially constant cross-sectional area that extends in a generally vertical direction down through the top plate 514. The narrowed region 526 is the portion of the gas flow between the mixer 304 and the deposition chamber 200 with the smallest cross-sectional area (with respect to gas flow). The narrowed region 526 is configured to create sufficient back pressure to provide uniform flow, particularly along the width w (see FIG. 8) of the deposition chamber 200. The end of the narrowed 526 is in communication with an expansion portion 528. The expansion portion 528 includes a slowed or tapered wall 529 that is configured to increase the cross-sectional area of the gas flow such that the gas gradually expands as it enters the deposition chamber 200. The outlet 530 of the expansion portion 528 is in communication with deposition chamber 200.

Advantageously, the narrowed region 526 is vertically and horizontally elongated (a three-dimensional path) across the deposition chamber 200 (see FIG. 8) as compared to individual holes (a substantially two-dimension path) in the shim 500 described with reference to FIG. 5. For example, as compared to the individual holes, recirculation cells and dead spaces in the x-plane (i.e. between holes) and in the z-direction (i.e., beneath the holes) are eliminated or reduced. Advantageously, this arrangement of the transfer member 510, plenum 512 and top plate 514 also takes the gas from the mixer 304 and extends it over a portion of the deposition chamber 200. The gas flow is then turned 180 degrees as it flows into deposition chamber 200.

Figure 10:
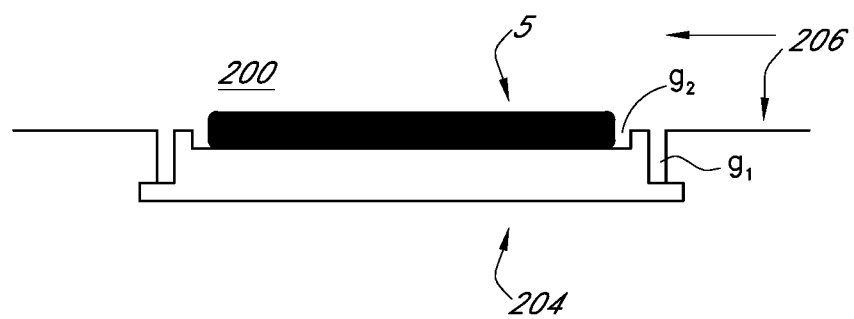
FIG. 10 is a schematic illustration of a susceptor, a substrate and a bottom plate of a reactor within the ALD system of FIG. 1.

Within the deposition chamber 200, dead volumes and/or recirculation cells can also be formed. For example, FIG. 10 is a schematic illustration of the substrate S and susceptor plate 204 of the deposition chamber 200 of FIG. 1-4. As shown, there exists a gap g2 between the substrate S and the susceptor plate 204 and a gap g1 between the susceptor plate 204 and the base plate 206. In certain circumstances, these gaps g1, g2 can be difficult to purge and may harbor recirculation cells and/or be dead volumes.

Figure 11:
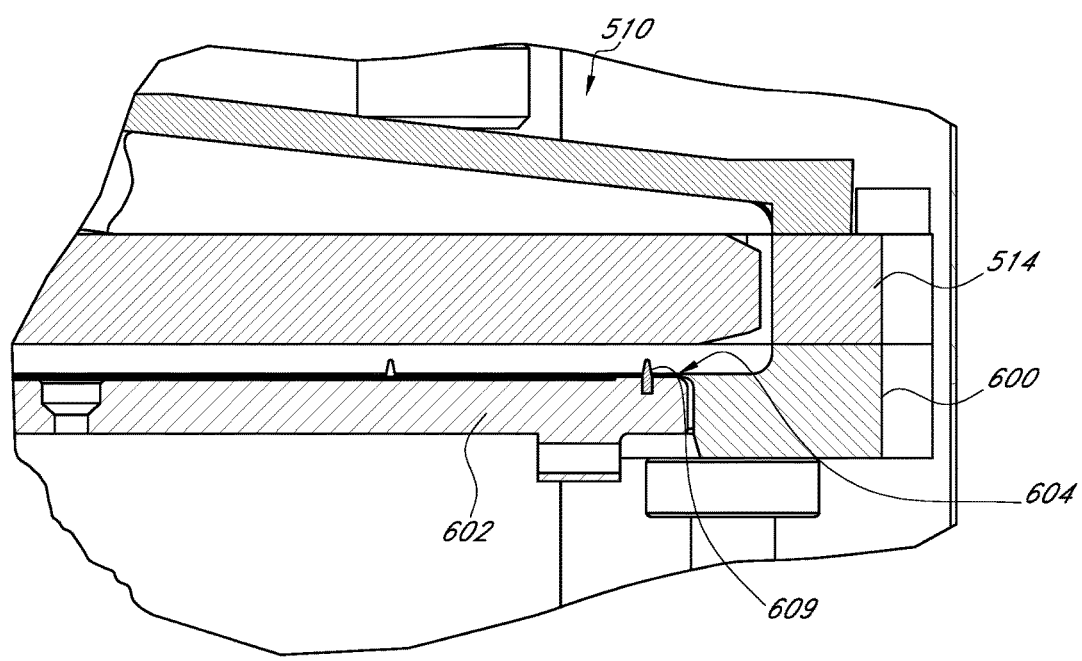
FIG. 11 is a cross-sectional view similar to FIG. 9 but also illustrating a susceptor and bottom plate of the ALD device.
Figure 12:
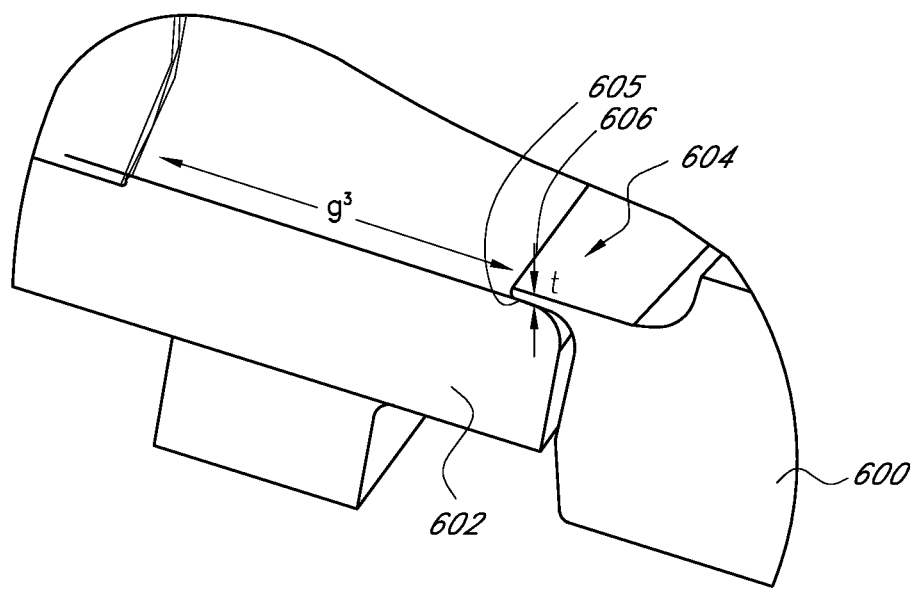
FIG. 12 is a partial top perspective view of the susceptor and bottom plate of FIG. 11.

FIG. 11 is a partial cross-sectional view of a modified embodiment of the bottom plate 600 and susceptor 602 of the deposition chamber 200 taken along a line similar to line 9-9 of FIG. 7. FIG. 12 is a partial perspective view of the bottom plate 600 and susceptor 602. As shown, in this embodiment, the base plate 600 has a sealing portion 604 with a thickness t. The lower surface 605 of the sealing portion 604 seals against the susceptor 602 to seal the reaction chamber. In one embodiment, the end 606 of the sealing portion 604 has a thickness t that is approximately equal to the thickness of the substrate positioned on the susceptor 602. Depending on the thickness of the substrate, the sealing portion 604 can have a thickness in the range from about 0.5 to about 3 millimeters. In this manner, as the gas flows over the bottom plate 600 towards the substrate, the gas is only exposed to a shallow step, which has a depth approximately equal to the thickness of the substrate. This reduces the size of or eliminates recirculation zones and facilitates purging the deposition chamber 200.

Another advantage of the bottom plate 600 and susceptor 602 arrangement illustrated in FIGS. 11 and 12 is that the seal or contact surface between the bottom plate 600 and the susceptor 602 is elevated as compared the arrangement of FIG. 10. For example, in the illustrated embodiment, the lower surface 605 of the sealing portion 604 and the substrate are positioned substantially at the same vertical elevation. In one embodiment, the difference in elevation between the lower surface 605 and the substrate is between about 0 to about 2 millimeters. This arrangement advantageously reduces the volume of the dead space between the substrate and the bottom plate 604 and prevents or reduces the formation of recirculation cells in the deposition chamber 200.

Figure 13:
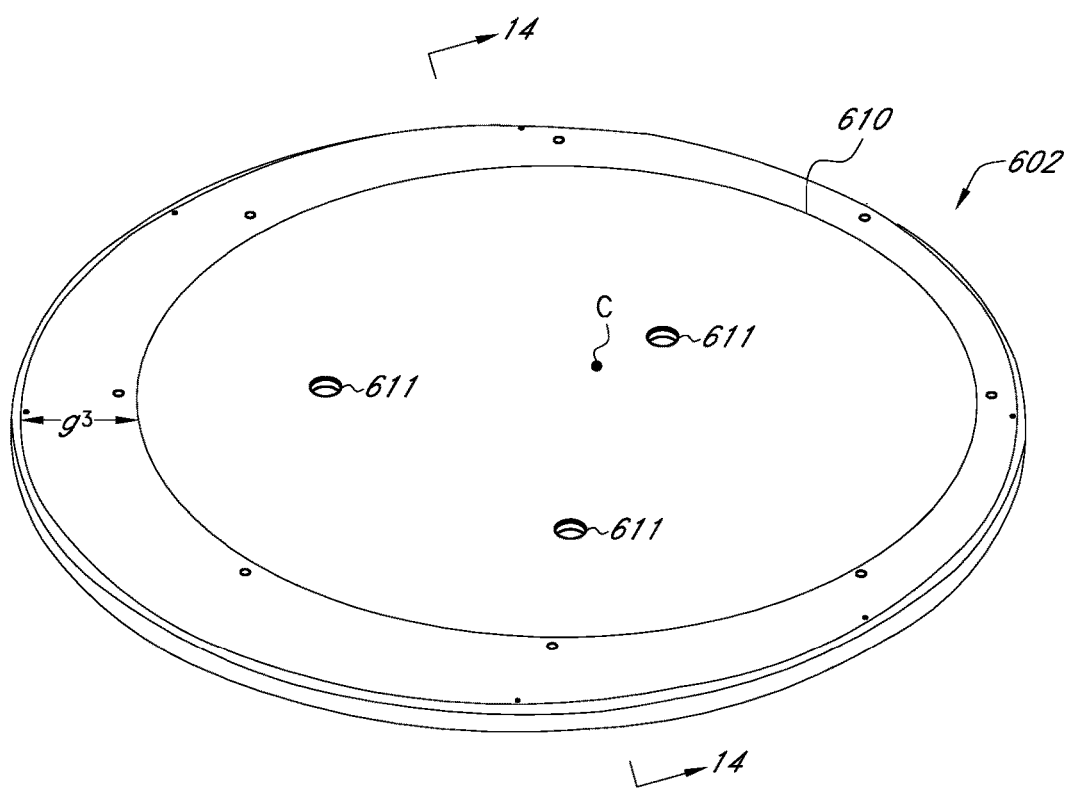
FIG. 13 is a top perspective view of the susceptor of FIG. 11 rotated 180 degrees.
Figure 14:
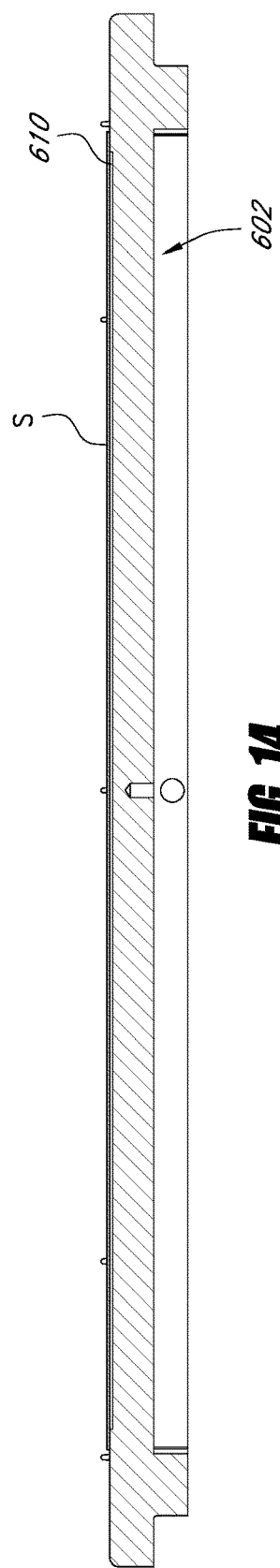
FIG. 14 is a cross-sectional view taken through line 14-14 of FIG. 13 and further illustrating a substrate positioned on the susceptor.

FIGS. 13 and 14 illustrates in more detail the susceptor 602. FIG. 13 is a top perspective view of the susceptor 602, which has been rotated 180 degrees with respect to the orientation shown in FIGS. 11 and 12. FIG. 14 is a cross-sectional view of the susceptor 602 with a substrate positioned thereon.

In this embodiment, the susceptor 602 is configured such that the substrate S can be positioned off-center with respect deposition chamber 200. In this manner, the gap g3 between the substrate and the interface between the susceptor 602 and the bottom plate 600 can be displaced further away from the leading edge (with respect to gas flow) of the substrate S. In general, the leading edge of the substrate is positioned near the inlet into the deposition chamber 200 as compared to a trailing edge of the substrate, which is positioned near on outlet (exhaust) of the deposition chamber 200.

In another embodiment, the substrate can be centered (or substantially centered) on the susceptor. In such an embodiment, the susceptor can be oversized to increase the distance between the interface between susceptor 602 and the bottom plate 600 and the edge of the substrate. In one embodiment, the susceptor 602 has a diameter that is at least about 10% greater than the diameter of the substrate. In another embodiment, this diameter of the susceptor is at least about 25% greater than the diameter of the substrate. In another embodiment, the diameter of the susceptor is between about 10% and about 25% greater than the diameter of the substrate. Such embodiments also provide for more space between the leading edge of the substrate and the interface between the susceptor and sealing surface. The oversized susceptor described above can also be used alone or in combination with the offset features described in this paragraph to provide even more space the leading edge of the substrate and the interface between the susceptor and sealing surface.

Advantageously, for a susceptor of equivalent width and/or size, the gap g3 between the leading edge of the substrate and the interface between the susceptor 602 and the bottom plate 600 can be increased. In this manner, any recirculation cells caused by discontinuities between the susceptor 602 and the bottom plate 600 are displaced further from the leading edge of the substrate S. Thus, in one embodiment, the center of the substrate positioned on the susceptor 602 is positioned asymmetrically and/or off-center with respect to the interface or seal between the susceptor 602 and the bottom plate 600. In a modified embodiment, the susceptor can have a non-round or asymmetrical shape to further distance the leading edge of the substrate from discontinuities between the susceptor 602 and the bottom plate 600.

As shown in FIG. 11, the susceptor 602 can include a plurality of pins 609 that extend from the top surface of the susceptor 602 to constrain or confine movement of the substrate on the susceptor. The pins 609 can replace shoulders or ridges (see e.g., the shoulder that creates the gap g2 in FIG. 10) that are sometimes used to constrain or confine movement of the substrate. Such shoulders or ridges can disadvantageously create recirculation and/or dead zones. Thus, in one embodiment, a top area of the susceptor between the interface between the sealing surface and the susceptor is substantially flat and does not include such shoulders or ridges. Such an arrangement can eliminate or recirculation and/or dead zones.

With continued reference to FIG. 13 and with reference to FIG. 14, the susceptor can include a recessed region 610, which is configured such that the substrate is only (or substantially only) contacted on its edges (see FIG. 14). This embodiment helps to reduce wafer curvature and/or susceptor doming from becoming problematic. In particular, wafer curvature and/or doming can cause a gap to form between the edge of the substrate and the susceptor. Gases can become trapped in this gap making purging inefficient and causing backside deposition. By contacting the substrate along its edges as shown in FIG. 14, wafer curvature and/or doming will not cause a gap to form between the edge of the substrate S and the susceptor 602. This eliminates or reduces the tendency for gases to become trapped between the substrate and the susceptor. In one embodiment, the recess region 610 has a depth between about 0.2 to 0.5 millimeters. In another embodiment, the substrate S and susceptor 602 are configured such that a continuous or substantially continuous seal is formed along the edge of the substrate S.

With continued reference to FIG. 13, the recess 610 can have a generally circular shape such that the seal between the susceptor 602 and the substrate is also generally circular. In addition, as shown, the center c of the recess 610 can be positioned "off-center" with respect to the outer edge of the generally circular susceptor 602. In this manner, the leading (with respect to gas flow) edge of the substrate can be distanced from the sealing portion 604 of the bottom plate 600 as compared to the trailing edge as described above. This allows the wafer to be placed a greater distance from the recirculation cells in front of the wafer. Since the gas is swept across the wafer in a cross flow reactor, re-circulation cells on the rear seal between the susceptor and base plate do not affect deposition uniformity as much.

Figure 15:
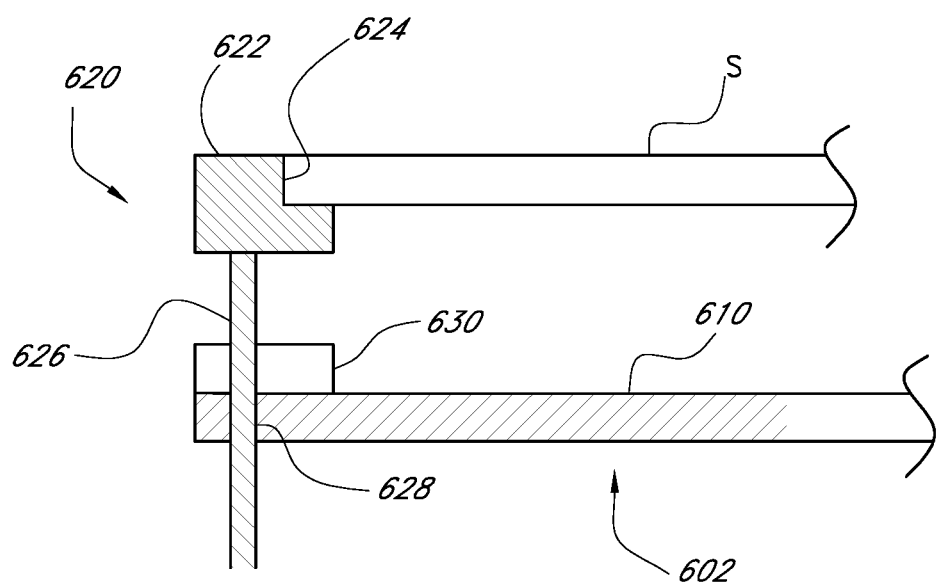
FIG. 15 is a schematic cross-sectional illustration of an edge portion of an embodiment of a lift pin and susceptor arrangement.

FIG. 15 illustrates partial cross-sectional view of embodiment of an edge contact lift pin 620 that could be used in combination with the susceptor 602 described above. As shown, the pin 620 can include a pin head 622 that includes a notch 624 or beveled edge for securing the substrate S. The pin head 622 is configured to contact the edge of the substrate and lies generally at the interface between the susceptor 602 and the recess region 610. The pin head 622 can be coupled to a pin shaft 626, which extends through openings 628 in the susceptor.

The pin 620 can be configured such that when the susceptor 602 is raised into the deposition chamber 200, the pin head 622 becomes recessed within a recessed region 630 formed in the susceptor 602. As the susceptor is lowered, the pin head 622 can be raised with respect to the susceptor 602. For example, as described in U.S. patent application Ser. No. 11/334,339, filed on Jan. 17, 2006 and published on Jul. 20, 2006 as U.S. Patent Application Publication No. 2006/0156981 (the entirety of which is incorporated by reference herein), in one embodiment, to the raise the pin 620 from a "lowered" position seated in the recess 630, the substrate is moved downward by a lifting mechanism. This downward movement causes the bottom surface the support pin 620 to contact a connector (not shown) positioned below the susceptor 602. The contact of the pin 620 with the connector compresses a spring (not shown) surrounding a lower portion of the shaft 626. As the spring is compressed while the susceptor 602 is moved downward, the spring attains a restoring force that will facilitate relative "lowering" of the pin 620 when the susceptor 620 is lifted next time. Accordingly, the combination of the spring and the platform or "floor" for downward pin movement provided by the connector permits the pin to remain relatively fixed while the susceptor 602 moves up and down, without requiring the pin to be fixed relative to the deposition chamber 200.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combine with or substituted for one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A substrate support for processing semiconductor substrates, the substrate support comprising:
a top surface extending along a first plane;
a recess formed in the top surface and extending between a circumferential wall that surrounds the recess, the circumferential wall extending downward from the first plane to a bottom surface of the recess, the bottom surface extending horizontally across the recess to connect opposite sides of the circumferential wall, the recess being configured such that the first plane of the top surface of the substrate support contacts a substrate only along an edge portion of a lower surface of the substrate; and
a plurality of pins extending upward from the first plane of the top surface in locations spaced radially outward from the circumferential wall, wherein adjacent pins of the plurality of pins are separated from each other by a circumferential space there between, wherein the top surface extending along the first plane is located along the circumferential space between the adjacent pins, is located between each pin and the circumferential wall on a radially inner side of each pin, and is located between each pin and an outer edge of the substrate support on a radially outer side of each pin, each of the plurality of pins having a side surface at least partially facing toward the circumferential wall, wherein the side surface is configured to contact an outward facing surface of the edge portion of the substrate to thereby horizontally constrain the substrate over the recess on the top surface.

2. The substrate support of claim 1, wherein the recess is asymmetrically positioned on the top surface of the substrate support such that a first edge portion of the recess is a first distance from a first adjacent edge portion of the substrate support, and a second edge portion of the recess is opposite from the first edge portion of the recess and is positioned a second distance from a second adjacent edge portion of the substrate support, wherein the first distance is greater than the second distance.

3. The substrate support of claim 1, wherein the recess has a depth from about 0.2 to about 0.5 millimeters.

4. The substrate support of claim 1, wherein the recess has a generally circular shape.

5. The substrate support of claim 4, wherein a center of the generally circular recess is positioned off-center with respect to an outer edge of the substrate support.

6. The substrate support of claim 1, wherein the top surface of the substrate support is configured to form a generally circular seal with the substrate when the substrate is positioned on the substrate support.

7. The substrate support of claim 6, wherein a center of the generally circular seal is positioned off-center with respect to an outer edge of the support.

8. The substrate support of claim 1, wherein a top area of the substrate support between an edge of the substrate support and the recess is substantially flat.

* * * * *